(12) United States Patent
Galan et al.

(10) Patent No.: US 6,893,780 B1
(45) Date of Patent: May 17, 2005

(54) PHOTOMASK AND METHOD FOR REDUCING ELECTROSTATIC DISCHARGE ON THE SAME WITH AN ESD PROTECTION PATTERN

(75) Inventors: Gérald Galan, Boulogne Billancourt (FR); Eric Souleillet, Pourrieres (FR)

(73) Assignee: DuPont Photomasks, Inc., Round Rock, TX (US)

( * ) Notice: Subject to any disclaimer, the term of this patent is extended or adjusted under 35 U.S.C. 154(b) by 115 days.

(21) Appl. No.: 10/290,574

(22) Filed: Nov. 8, 2002

Related U.S. Application Data

(60) Provisional application No. 60/337,969, filed on Nov. 9, 2001.

(51) Int. Cl.[7] .............................. G03F 9/00; A47G 1/12
(52) U.S. Cl. ............................................. 430/5; 428/14
(58) Field of Search .............................. 430/5; 428/14; 257/355

(56) References Cited

U.S. PATENT DOCUMENTS

| | | | |
|---|---|---|---|
| 5,989,754 A | 11/1999 | Chen et al. ..................... | 430/5 |
| 6,180,291 B1 | 1/2001 | Bessy et al. ..................... | 430/5 |
| 6,309,781 B1 * | 10/2001 | Gemmink et al. ............. | 430/5 |
| 6,440,617 B1 * | 8/2002 | Deng et al. ..................... | 430/5 |

* cited by examiner

Primary Examiner—S. Rosasco
(74) Attorney, Agent, or Firm—Baker Botts L.L.P.

(57) ABSTRACT

A photomask and method for reducing electrostatic discharge on the photomask with an ESD protection pattern are disclosed. A photomask includes a substrate and a patterned layer formed on at least a portion of the substrate. The patterned layer includes an electrostatic discharge (ESD) patterned formed between an outer perimeter of an active region and an inner perimeter of a frame region. The ESD pattern reduces ESD effects in the patterned layer.

21 Claims, 2 Drawing Sheets

PHOTOMASK AND METHOD FOR REDUCING ELECTROSTATIC DISCHARGE ON THE SAME WITH AN ESD PROTECTION PATTERN

CROSS REFERENCE TO RELATED APPLICATION

This application claims priority from U.S. Provisional Patent Application Ser. No. 60/337,969, filed Nov. 9, 2001, and entitled "Photomask Electrostatic Discharge Protection Pattern."

FIELD OF THE INVENTION

The present invention relates in general to semiconductor manufacturing and, more particularly to a photomask and method for reducing electrostatic discharge on the same with an ESD protection pattern.

BACKGROUND OF THE INVENTION

Over the past several years, the development of electronic devices such as laptop computers, hand held computers, personal data assistants (PDA) and global telephones has resulted in an increased demand for smaller semiconductor integrated circuits (IC) and other associated electronic components. In order to meet this demand, manufactures have developed several techniques to reduce the overall size and dimensions of an electrical component. Specifically, some of these techniques are aimed at circuit geometries that include smaller and more dense electrical components.

The manufacturing of complex semiconductor devices typically involves a series of processing steps, including deposition, photolithography and etching. During the photolithography process, semiconductor manufacturers use a photomask or a reticle to copy an image of an electronic circuit onto a semiconductor wafer. Photomasks generally include a transparent substrate that has a patterned opaque layer deposited on one surface. The patterned opaque layer typically includes multiple features that form a microscopic image of the electronic circuit.

As design rules have moved toward smaller and denser IC devices, the integrity of geometry on the photomask has become increasingly important. One key cause of degradation of the patterned layer on the photomask is electrostatic discharge (ESD). ESD is created when a force causes a charge imbalance among the features in the patterned layer of the photomask. For example, the substrate may become statically charged during handling. The static may attract contaminants, such as dust and other particles, to the photomask and degrade the microscopic image projected on to the semiconductor wafer. ESD may result when the opposite charge between features reaches a threshold, and the charge is passed between the features. This exchange of charge between features may cause damage to the photomask. In the case of very small patterns on the photomask, the damage may be severe enough to melt and/or blast the features in the patterned layer. The damage to the photomask may result in wafer scrap, rework, photomask repair, and considerable engineering and manufacturing time spent on in-line inspections and defect analysis.

SUMMARY OF THE INVENTION

In accordance with teachings of the present invention, disadvantages and problems associated with reducing electrostatic discharge (ESD) effects on a photomask have been substantially reduced or eliminated. In a particular embodiment, a photomask includes an ESD pattern that exposes a surface of a substrate between an active region and a frame region formed in a patterned layer to reduce ESD effects in the patterned layer.

In accordance with one embodiment of the present invention, a photomask includes a substrate and a patterned layer formed on at least a portion of the substrate. The patterned layer includes an electrostatic discharge (ESD) pattern formed between an outer perimeter of an active region and an inner perimeter of a frame region. The ESD pattern reduces ESD effects in the patterned layer.

In accordance with another embodiment of the present invention, a photomask assembly includes a substrate and a patterned layer formed on at least a portion of the substrate. The patterned layer includes an electrostatic discharge (ESD) pattern formed around a perimeter of an active region. The ESD pattern exposes a surface of the substrate and reduces ESD effects in the patterned layer. A pellicle assembly includes a pellicle film attached to a pellicle frame. The pellicle frame is coupled to the exposed surface of the substrate opposite the pellicle film.

In accordance with a further embodiment of the present invention, a method for reducing electrostatic discharge effects on a photomask includes providing a substrate with a patterned layer formed on at least a portion of the substrate. The patterned layer includes an active region and a frame region. An electrostatic discharge (ESD) pattern is formed between the active region and the frame region to expose a surface of the substrate. The ESD pattern prevents a charge from being transferred between the frame region and the active region.

Important technical advantages of certain embodiments of the present invention include an ESD pattern that reduces the risk of ESD effects within a patterned layer formed on a substrate. The ESD pattern surrounds an active region on a photomask, exposes a surface of the substrate and isolates the active region from a frame region. Since the ESD pattern provides a gap between the frame region and the active region, any change in charge that is present in the frame region will not propagate in to the active region because the charge cannot travel through the ESD pattern. The active region, therefore, is protected from any ESD effects that occur in the frame region.

Another important technical advantage of certain embodiments of the present invention includes an ESD pattern that reduces the amount of damage that may occur to a photomask when a pellicle assembly is removed and the photomask is cleaned. Since the ESD pattern exposes the surface of the substrate around an outer perimeter of an active region, a pellicle frame may be mounted on the exposed surface with an adhesive layer such that a pellicle film protects the active region. Since there is less adhesive force between the substrate and the adhesive layer, less force is required to remove the pellicle assembly and thus, the potential for warping or otherwise damaging the photomask is reduced. Furthermore, adhesive residue that remains on the photomask after the pellicle assembly is removed is much easier to clean off of the substrate than the pattered layer, resulting in less damage to the photomask.

A further important technical advantage of certain embodiments of the present invention includes a fuse pattern that monitors ESD effects on a photomask used in a manufacturing process. The fuse pattern is formed in a frame region on the photomask. During the semiconductor device manufacturing process, the fuse pattern monitors the damage to the photomask caused by the ESD effects. The photomask may be removed from the semiconductor manufacturing process if the fuse pattern indicates that ESD effects may have damaged the photomask.

All, some, or none of these technical advantages may be present in various embodiments of the present invention. Other technical advantages will be readily apparent to one skilled in the art from the following figures, descriptions, and claims.

BRIEF DESCRIPTION OF THE DRAWINGS

A more complete and thorough understanding of the present embodiments and advantages thereof may be acquired by referring to the following description taken in conjunction with the accompanying drawings, in which like reference numbers indicate like features, and wherein.

DETAILED DESCRIPTION OF THE INVENTION

Preferred embodiments of the present invention and their advantages are best understood by reference to FIGS. 1 through 4, where like numbers are used to indicate like and corresponding parts.

Figure 1:
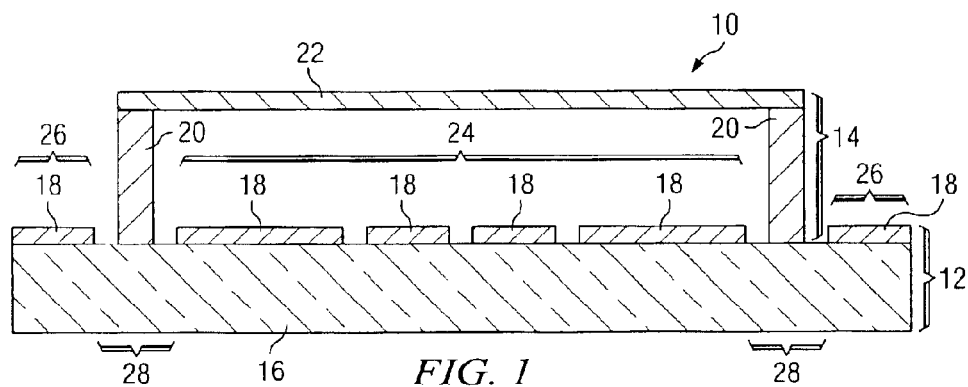
FIG. 1 illustrates a cross-sectional view of a photomask assembly that includes an electrostatic discharge (ESD) pattern according to teachings of the present invention.

FIG. 1 illustrates a cross-sectional view of photomask assembly 10 including electrostatic discharge (ESD) pattern 28 formed in patterned layer 18. Photomask assembly 10 includes photomask 12 coupled to pellicle assembly 14. Substrate 16 and patterned layer 18 form photomask 12, otherwise known as a mask or reticle, that may have a variety of sizes and shapes, including but not limited to round, rectangular, or square. Photomask 12 may also be any variety of photomask types, including, but not limited to, a one-time master, a five-inch reticle, a six-inch reticle, a nine-inch reticle or any other appropriately sized reticle that may be used to project an image of a circuit pattern onto a semiconductor wafer. Photomask 12 may further be a binary mask, a phase shift mask (PSM), an optical proximity correction (OPC) mask or any other type of mask suitable for use in a lithography system.

Photomask 12 includes patterned layer 18 formed on substrate 16 that, when exposed to electromagnetic energy in a lithography system, projects a pattern onto a surface of a semiconductor wafer (not expressly shown). Substrate 16 may be a transparent material such as quartz, synthetic quartz, fused silica, magnesium fluoride ($MgF_2$), calcium fluoride ($CaF_2$), or any other suitable material that transmits at least seventy-five percent (75%) of incident light having a wavelength between approximately 10 nanometers (nm) and approximately 450 nm. In an alternative embodiment, substrate 16 may be a reflective material such as silicon or any other suitable material that reflects greater than approximately fifty percent (50%) of incident light having a wavelength between approximately 10 nm and 450 nm.

Patterned layer 18 may be a metal material such as chrome, chromium nitride, a metallic oxy-carbo-nitride (M—O—C—N), where the metal is selected from the group consisting of chromium, cobalt, iron, zinc, molybdenum, niobium, tantalum, titanium, tungsten, aluminum, magnesium and silicon, and any other suitable material that absorbs electromagnetic energy with wavelengths in the ultraviolet (UV) range, deep ultraviolet (DUV) range, vacuum ultraviolet (VUV) range and/or extreme ultraviolet range (EUV). In an alternative embodiment, patterned layer 18 may be a partially transmissive material, such as molybdenum silicide (MoSi), which has a transmissivity of approximately one percent (1%) to approximately thirty percent (30%) in the UV, DUV, VUV and/or EUV ranges.

Frame 20 and pellicle film 22 may form pellicle assembly 14. Frame 20 is typically formed of anodized aluminum, although it could alternatively be formed of stainless steel, plastic or other suitable materials that do not degrade or outgas when exposed to electromagnetic energy within a lithography system. Pellicle film 22 may be a thin film membrane formed of a material such as nitrocellulose, cellulose acetate, an amorphous fluoropolymer, such as TEFLON® AF manufactured by E. I. du Pont de Nemours and Company or CYTOP® manufactured by Asahi Glass, or another suitable film that is transparent to wavelengths in the V, DUV, EUV and/or VUV ranges. Pellicle film 22 may be prepared by a conventional technique such as spin casting.

Pellicle film 22 protects photomask 12 from dust particles and other contaminants by ensuring that the contaminants remain a defined distance away from photomask 12. This may be especially important in a lithography system. During a lithography process, photomask assembly 10 is exposed to electromagnetic energy produced by a radiant energy source within the photolithography system. The electromagnetic energy may include light of various wavelengths, such as wavelengths approximately between the I-line and G-line of a Mercury arc lamp, or DUV, VUV or EUV light. In operation, pellicle film 22 is designed to allow a large percentage of the electromagnetic energy to pass through it. Dust particles collected on pellicle film 22 will likely be out of focus at the surface of the wafer being processed and, therefore, the exposed image on the wafer should be clear. Pellicle film 22 formed in accordance with the teachings of the present invention may be satisfactorily used with all types of electromagnetic energy and is not limited to lightwaves as described in this application.

Photomask 12 may be formed from a photomask blank using a standard lithography process. In a lithography process, a mask pattern file that includes data for patterned layer 18 may be generated from a mask layout file. The mask layout file may include polygons that represent transistors and electrical connections for an integrated circuit. The polygons in the mask layout file may further represent different layers of the integrated circuit when it is fabricated on a semiconductor wafer. For example, a transistor may be formed on a semiconductor wafer with a diffusion layer and a polysilicon layer. The mask layout file, therefore, may include one or more polygons drawn on the diffusion layer and one or more polygons drawn on the polysilicon layer. The polygons for each layer may be converted into a mask pattern file that represents one layer of the integrated circuit. Each mask pattern file may be used to generate a photomask for the specific layer.

The desired pattern may be imaged into a resist layer of the photomask blank using a laser, electron beam or X-ray lithography system. In one embodiment, a laser lithography system uses an Argon-Ion laser that emits light having a wavelength of approximately 364 nanometers (nm). In alternative embodiments, the laser lithography system uses lasers emitting light at wavelengths from approximately 150 nm to approximately 300 nm. Photomask 12 may be fabricated by developing and etching exposed areas of the resist layer to create a pattern, etching the portions of patterned layer 18 not covered by resist, and removing the undeveloped resist to create patterned layer 18 over substrate 16.

Photomask 12 further includes ESD pattern 28 that is located between active region 24 and frame region 26 in patterned layer 18 and exposes a surface of substrate 16 under frame 20. Active region 24 may be substantially located within frame 20 and under pellicle film 22, and frame region 26 may extend from near frame 20 to the edge or near the edge of substrate 16. ESD pattern 28 isolates active region 24 from frame region 26 and reduces the possibility that a discharge will occur between frame region 26 and the features in active region 24 located adjacent to frame region 26. For example, when photomask assembly 10 is loaded into a processing tool, such as an inspection tool, metrology tool, lithography system, or any other tool used in a photomask and/or semiconductor manufacturing process, frame region 26 may be grounded. By grounding frame region 26, all of the charge is removed from patterned layer 18 within frame region 26. Patterned layer 18 within active region 24, however, may remain charged. Without ESD pattern 28, the features in active region 24 that are adjacent to frame region 26 may discharge. This discharge can then propagate to adjacent features in active region 24 and damage the pattern used to create an integrated circuit (IC) on a semiconductor wafer.

ESD pattern 28 provides a separation or gap between active region 24 and frame region 26 that does not include any type of conductive medium. In one embodiment, ESD pattern 28 forms an outer perimeter of active region 24 and an inner perimeter of frame region 26. If frame region 26 is grounded and active region 24 remains charged, active region 24 will not discharge because the charge cannot travel across the separation provided by ESD pattern 28. ESD pattern 28, therefore, protects active region 24 from ESD effects that occur when photomask assembly 10 is transported in a manufacturing facility, loaded into a processing tool or handled or used in any other manner in the manufacturing facility that may introduce static charge onto frame region 26 and/or active region 24. In one embodiment, ESD pattern 28 may have a width approximately equal to or greater than one micron. In another embodiment, the width of ESD pattern 28 may be greater than a width of frame 20.

ESD pattern 28 further provides an area on substrate 16 on which to mount frame 20 of pellicle assembly 14. In conventional photomask assemblies, the pellicle may be mounted directly on the conductive layer. If the pellicle assembly has to be removed, the adhesive used to mount the pellicle frmae on the conductive layer may damage the conductive layer and the force used to remove the pellicle assembly may cause the photomask to warp. In the present invention, frame 20 may be mounted directly on the surface of substrate 16. There may be less adhesion between substrate 16 and the adhesive used to mount pellicle assembly 14 on photomask 12 than the adhesion between patterned layer 18 and the adhesive. The smaller amount of adhesive force may make it easier to remove pellicle assembly 14 from photomask 12 and may prevent damage from occurring to patterned layer 18 and/or substrate 16. Furthermore, any residue from the adhesive that remains on the surface of substrate 16 may be easy to remove during a cleaning process because substrate 16 is easier to clean than patterned layer 18.

Figure 2A:
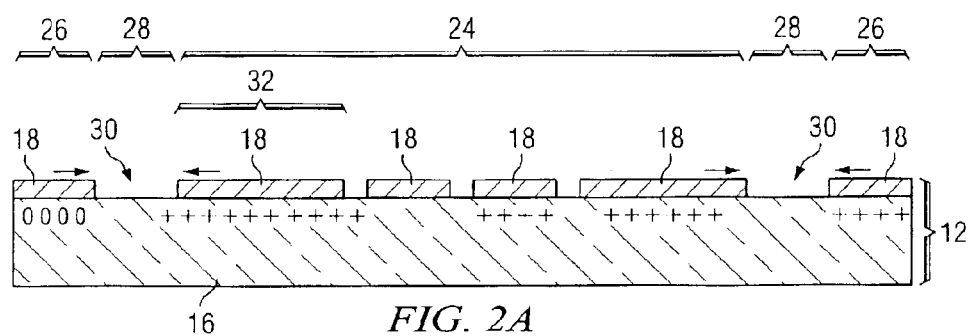
FIGS. 2A and 2B illustrate cross-sectional views of a photomask with ESD effects that may occur on the photomask.

FIGS. 2A and 23 illustrate cross-sectional views of photomask 12 that respectively include ESD effects 30 and 34. In one embodiment, a charge generation (e.g., a positive charge) may occur in frame region 26 and active region 24 of patterned layer 18 due to a homogeneous field created by a compact used to transfer the photomask between tools in a manufacturing facility or between different manufacturing facilities, airflow in a processing tool or any other type of environment that may cause an electrical charge to be induced in a conductive material such as patterned layer 18. As illustrated in FIG. 2A, frame region 26 may be grounded when photomask assembly 10 is loaded into a tool, such as a scanning tool, metrology tool, inspection tool, lithography tool or any other tool used in a photomask or semiconductor device manufacturing process. When frame region 26 is grounded, the charge may be removed from frame region 26. Active region 24, however, may remain charged.

If there is no separation between frame region 26 and active region 24 or if the separation is too small, ESD 30 may be generated by an electrical discharge that occurs between frame region 26 and feature 32 in active region 24. ESD 30 may then propagate further into active region 24. In one embodiment, ESD 30 may propagate through as many as twenty-five features in active region 24. The propagation of ESD 30 into active region 24 may damage photomask 12 by degrading the patterns located in active region 24. For example, ESD 30 that occurs between two features may cause a break in a line of a pattern on photomask 12. This break may be projected onto a wafer and cause a failure in a device because current cannot flow across the break in the projected pattern.

ESD pattern 28 may provide an appropriate space or gap between active region 24 and frame region 26. When frame region 26 is grounded, ESD effect 30 cannot propagate into active region 24 because ESD pattern 28 eliminates the conductive medium (e.g., patterned layer 18) between active region 24 and frame region 26. ESD pattern 28, therefore, prevents a discharge from occurring in active region 24 and protects photomask 12 from being damaged by ESD effect 30.

Figure 2B:
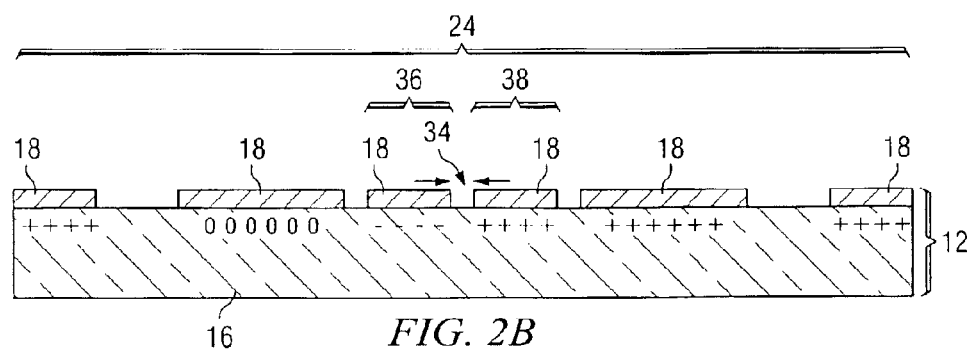

As illustrated in FIG. 2B, localized electrical charges may occur within active region 24 due to a heterogeneous electrical charge generation and create ESD 34. For example, feature 36 may have a negative charge and feature 38 may have a positive charge. If features 36 and 38 are located close to each other in an isolated area within active region 24, the charge from either of features 36 and 38 may travel through other features in active region 24 and create ESD 34 within active region 24.

The potential for ESD 30 and 34 between adjacent features in either or both of active region 24 and frame region 26 typically decreases when the distance between the electrically charged features increases. As shown in FIG. 2A, ESD pattern 28 may prevent features in frame region 26 and active region 24 from being damaged due to ESD 30 by reducing the possibility that feature 32 in active region 24 will discharge. ESD pattern 28, however, may not prevent ESD 34 from occurring within active region 24 since photomask 12 may include positive and/or negative charges in within active region 24 and ESD 34 may be generated by environmental changes that occur to photomask assembly 10. Typically, ESD 30 causes the most damage to photomask assembly 10 and occurs more frequently than ESD 34. ESD pattern 28, therefore, reduces the amount of damage to photomask assembly 10 caused by the various types of ESD effects.

Figure 3:
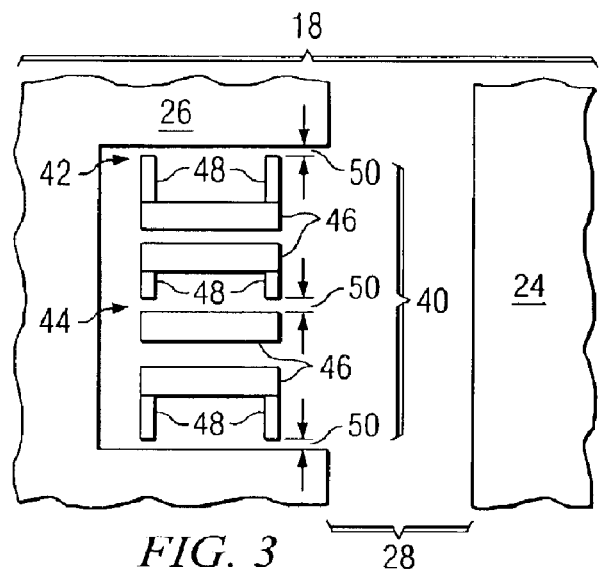
FIG. 3 illustrates a top view of a fuse pattern contained in frame region of a patterned layer formed on a photomask according to teachings of the present invention.

FIG. 3 illustrates a top view of fuse pattern 40 contained in frame region 26 of patterned layer 18. Fuse pattern 40 contains frame pattern 42 and active pattern 44. Frame pattern 42 may be used to determine how much electrostatic stress occurs between frame region 26 and features in active region 24. Active pattern 44 may be used to determine how much electrostatic stress occurs between any adjacent features in patterned layer 18. Frame and active patterns 42 and 44 may be formed of bodies 46, lines 48 and gaps 50. The number of frame and active patterns 42 and 44 and their configuration may be varied to monitor and evaluate the effects of ESD stress on photomask 12. In addition to varying the number and configuration of frame and active patterns 42 and 44, the dimensions of bodies 46, lines 48 and gaps 50 may be varied. For example, bodies 46 and lines 48 may be a generally square and/or rectangular. Lines 48 may have a width and/or length generally smaller than the width and/or length of bodies 46. Additionally, lines 48 may be triangular with the distal end forming a point. All dimensions of bodies 46, lines 48 and gaps 50 may be varied in order to improve the ESD monitoring ability for a given semiconductor manufacturing process and a desired design rule.

Frame and active patterns 42 and 44 may be easy to read, more sensitive to ESD effects than the features in active region 24 and may not conduct an electrostatic charge from frame region 26 to active region 24. Fuse pattern 40 may be used to evaluate the electrostatic stress that occurs on photomask 12 or photomask assembly 10 during their lifetimes. For example, photomask assembly 10 may be used multiple times to create semiconductor devices on a wafer. Each time photomask assembly 10 is loaded into a processing tool, ESD effects (e.g., ESD 30 and ESD 34 illustrated in FIGS. 2A and 2B respectively) may be generated on photomask 12. The ESD effects may damage photomask 12 over time and cause the quality of photomask 12 to degrade. A failure in fuse pattern 40 may indicate when the ESD effects have started to damage photomask 12 and/or photomask assembly 10. If fuse pattern 40 shows that the ESD effects have damaged photomask 12, photomask assembly 10 or photomask 12 may be removed from the semiconductor manufacturing process to prevent non-functioning devices from being created on the wafer.

EXAMPLE

ESD pattern 28 was placed on a test plate that included two columns of test die. Each column included three die with four lines of repeating patterns per die. Only one of the columns was protected by ESD pattern 28. The test plate was inspected with an inspection tool (e.g., a STARlight™ tool manufactured by KLA Tencor) before being tested. No defects were detected on the test plate. A charge was generated on a compact used to house the test plate by rubbing the test plate. The compact, including the test plate, was put in a chamber with low humidity (e.g., approximately five percent (5%) HR). The frame of the test plate was grounded with metallic picks. This test was performed in conditions conducive for creating ESD effects, such as ESD 30 and 34. These conditions were designed to be more severe than a typical semiconductor manufacturing environment (e.g., approximately fifty percent (50%) humidity) so that ESD would occur on photomask 12 in a shorter period of time than ESD would typically occur in a manufacturing environment.

Figure 4:
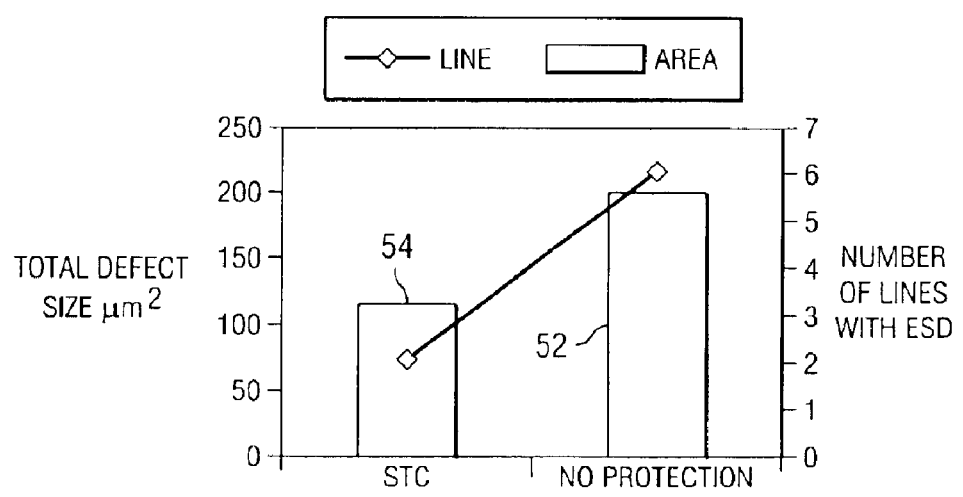
FIG. 4 illustrates a graph comparing the number of ESD failures that may occur on an unprotected photomask and a photomask including an ESD pattern according to teachings of the present invention.

The results of the test are illustrated by FIG. 4. Block 52 represents the defects detected in the column on the test wafer that did not include ESD pattern 28 and block 54 represents the defects detected in the column on the test wafer that included ESD pattern 28. As shown, the column on the test plate that contained no protection had more defective lines and more ESD errors than the column that was protected by ESD pattern 28. In the example, the column on the test plate that was not protected contained 77 ESD errors and six defective lines with a total defect size of approximately 200 square micrometers ($\mu m^2$). The column that was protected by ESD pattern 28 contained 37 ESD errors and two defective lines with a total defect size of approximately 115 $\mu m^2$. The ESD pattern 28, therefore, may reduce the number of ESD errors by approximately fifty percent.

Although the present invention has been described with respect to a specific preferred embodiment thereof, various changes and modifications may be suggested to one skilled in the art and it is intended that the present invention encompass such changes and modifications fall within the scope of the appended claims.

What is claimed is:

1. A photomask, comprising:
   a substrate; and
   a patterned layer formed on at least a portion of the substrate, the patterned layer including:
   an active region;
   a frame region including a fuse pattern operable to monitor electrostatic stress associated with the photomask; and
   an electrostatic discharge (ESD) pattern formed between an outer perimeter of the active region and an inner perimeter of the frame region, the ESD pattern operable to reduce ESD effects between the frame region of the patterned layer and the active region of the patterned layer.

2. The photomask of claim 1, wherein the ESD pattern forms the inner perimeter of the frame region of the patterned layer.

3. The photomask of claim 2, wherein the ESD pattern exposes a surface of the substrate between the active region and the frame region.

4. The photomask of claim 1, further comprising the fuse pattern including a plurality of bodies, lines and gaps.

5. The photomask of claim 1, further comprising the fuse pattern including a first pattern and a second pattern, the first pattern operable to monitor electrostatic stress created between at least two adjacent features in the patterned layer and the second pattern operable to monitor electrostatic stress created between one or more features in the active region of the patterned layer and the frame region of the patterned layer.

6. The photomask of claim 1, further comprising the active region including a circuit pattern operable to be imaged onto a semiconductor wafer.

7. The photomask of claim 1, further comprising the ESD pattern including a width greater than approximately one micron.

8. The photomask of claim 1, wherein the ESD effect comprises a homogeneous electrical charge.

9. The photomask of claim 1, further comprising the ESD effect created when the photomask is handled in a manufacturing facility.

10. A photomask assembly, comprising:
    a substrate;
    a patterned layer formed on at least a portion of the substrate, the patterned layer including:
    active region;
    a frame region; and
    an electrostatic discharge (ESD) pattern formed between an outer perimeter of the active region and an inner perimeter of the frame region, the ESD pattern exposing a surface of the substrate and operable to reduce ESD effects between the frame region of the patterned layer and the active region of the patterned layer; and a pellicle assembly defined in part by a pellicle frame and a pellicle film attached thereto, the pellicle frame coupled to the exposed surface of the substrate opposite the pellicle film.

11. The photomask assembly of claim 10, further comprising the frame region including a fuse pattern operable to monitor electrostatic stress associated with the photomask.

12. The photomask assembly of claim 11, further comprising the fuse pattern including a plurality of bodies, lines and gaps.

13. The photomask assembly of claim 11, further comprising the fuse pattern including a first pattern and a second pattern, the first pattern operable to monitor electrostatic stress created between at least two adjacent features in the patterned layer and the second pattern operable to monitor electrostatic stress created between one or more features in the active region of the patterned layer and the frame region of the patterned layer.

14. The photomask assembly of claim 10, further comprising the ESD pattern including a width greater than approximately one micron.

15. The photomask assembly of claim 10, wherein the ESD effect comprises a homogeneous electrical charge.

16. A method for reducing electrostatic discharge effects on a photomask, comprising:

providing a substrate with a patterned layer formed on at least a portion of the substrate, the patterned layer including an active region and a frame region, the frame region including a fuse pattern operable to monitor electrostatic stress associated with the photomask; and forming an electrostatic discharge (ESD) pattern between the active region and the frame region to expose a surface of the substrate, the ESD pattern operable to prevent a charge from being transferred between the frame region and the active region.

17. The method of claim 16, further comprising the fuse pattern including a plurality of bodies, lines and gaps.

18. The method of claim 16, further comprising the fuse pattern including a first pattern and a second pattern, the first pattern operable to monitor electrostatic stress created between at least two adjacent features in the patterned layer and the second pattern operable to monitor electrostatic stress created between one or more features in the active region of the patterned layer and the frame region of the patterned layer.

19. The method of claim 16, further comprising the ESD pattern including a width greater than approximately one micron.

20. The photomask assembly of claim 10, wherein:

the pellicle frame has a width in a first direction; and the ESD pattern has a width in the first direction greater than the width of the pellicle frame.

21. The photomask assembly of claim 10, wherein the pellicle frame is free from contact with the frame region of the patterned layer.

* * * * *